(12) United States Patent
Siddhartha et al.

(10) Patent No.: US 7,835,124 B2
(45) Date of Patent: Nov. 16, 2010

(54) SHORT CIRCUIT AND OVER-VOLTAGE PROTECTION FOR A DATA BUS

(75) Inventors: Gopal Krishna Siddhartha, New Delhi (IN); Kulbhushan Misri, Gurgaon (IN); Venkataramana Pandiri, Noida (IN)

(73) Assignee: Freescale Semiconductor, Inc., Austin, TX (US)

( * ) Notice: Subject to any disclaimer, the term of this patent is extended or adjusted under 35 U.S.C. 154(b) by 462 days.

(21) Appl. No.: 11/954,243

(22) Filed: Dec. 12, 2007

(65) Prior Publication Data

US 2008/0158757 A1    Jul. 3, 2008

(30) Foreign Application Priority Data

Jan. 2, 2007    (IN) ............................... 8/DEL/2007

(51) Int. Cl.
  *H02H 3/22* (2006.01)
(52) U.S. Cl. ...................................... 361/91.1; 361/111
(58) Field of Classification Search ................... 361/56, 361/91.1, 111, 119
See application file for complete search history.

(56) References Cited

U.S. PATENT DOCUMENTS

| | | | |
|---|---|---|---|
| 5,654,858 A | | 8/1997 | Martin et al. |
| 6,049,445 A | * | 4/2000 | Gauthier et al. ................ 361/56 |
| 6,400,546 B1 | * | 6/2002 | Drapkin et al. ............. 361/111 |
| 6,946,904 B1 | | 9/2005 | Varma et al. |
| 7,026,839 B1 | | 4/2006 | Wu et al. |
| 7,259,614 B1 | * | 8/2007 | Baker et al. .................. 327/538 |
| 7,667,939 B2 | * | 2/2010 | Kiuchi ...................... 361/91.1 |
| 2007/0047164 A1 | * | 3/2007 | Biagi ......................... 361/78 |

* cited by examiner

*Primary Examiner*—Danny Nguyen
(74) *Attorney, Agent, or Firm*—Charles Bergere

(57) ABSTRACT

An apparatus for protecting a device against an over-voltage condition that is in excess of its breakdown voltage includes a detector for detecting the over-voltage condition and a protection circuit for protecting the device in response to detection of the over-voltage condition. The protection circuit may include a transmission gate and a PMOS transistor for producing a protection signal. The protection signal may be applied to a gate and/or a drain and/or a source and/or a well of the device such that a voltage across the device does not exceed the breakdown voltage. The protection signal may be derived from the over-voltage condition independent of whether a supply of power to the device is present.

16 Claims, 4 Drawing Sheets

SHORT CIRCUIT AND OVER-VOLTAGE PROTECTION FOR A DATA BUS

BACKGROUND OF THE INVENTION

The present invention relates to a circuit or device that includes over-voltage and/or short circuit protection. In particular the present invention relates to an apparatus for protecting a device against an over-voltage condition that is in excess of its breakdown voltage. The device may include a transmitter and/or a receiver of data on a data line such as a universal serial bus (USB).

USB specifications require that a short circuit of a data line (DP/DM) of a USB module with a power supply line should be withstood. With shrinking process geometries, thin gate oxides used in current CMOS fabrication technologies are not able to withstand this over-voltage. Therefore, special protection schemes need to be employed.

Some prior art schemes rely on clamping diodes to limit voltages on data lines. The diodes are chosen to clamp any voltage above a stress limit of transistors used in an associated circuit and thereby protect the circuit. Clamping diodes are often implemented as part of ESD (electrostatic discharge) management circuits, which cause large current flows under short circuit conditions. Moreover, since Zener diodes are not available in conventional CMOS technologies, clamping diodes usually require off-chip components increasing product costs.

Other prior art schemes rely on high current drainage especially in a transmitter driver stage, such that a high voltage is never present across any device. However these schemes result in performance compromises and complexities due to additional layout considerations and higher parasitics. The prior art schemes also rely on a continuous supply of power being present for the protection schemes to be effective in the absence of which they fail to protect the devices.

FIG. 1 shows a prior art system using clamping diodes to limit voltage on data lines associated with a circuit. The diodes are chosen such that they clamp any voltage above the stress limit of transistors used in the circuit and thereby protect the circuit. This is either implemented as part of ESD circuits, which causes a large current flow in short conditions, or requires off-chip components since Zener diodes are not present in conventional CMOS technologies, thereby increasing cost.

FIG. 2 shows a prior art transmitter circuit that relies on high current drainage in an over-voltage condition especially in the transmitter driver stage, such that a high-voltage is never seen across any of the devices. For example, assuming 3.3V devices are used, if the data line (DP/DM) is shorted to 5V and Vdda is 3.3V, the pull-down path is turned off and protected by applying the voltages, C=Vdda (3.3V)

D=0V

The pull-up path is protected by applying the voltages,

A=Vdda (3.3V)

B=Vdda (3.3V)

For the pull-up, there is a constant current drain through the body and the channel of the PMOS device, which may be as high as 150-200 mA. Due to voltage drop across Rprotect, no device sees more than the breakdown voltage across it. This prior art scheme requires additional layout considerations and may lead to performance compromises because of higher parasitics. This scheme also has a disadvantage because if during a short circuit condition, the power Vdda falls to 0, it fails to protect the devices (NMOS with gate connected to C) in its absence.

It would be advantageous to have a short circuit and/or over-voltage protection scheme that does not depend on the presence of a power supply. This may be important for self-powered devices that switch off the supply until a USB session is required. It would also be advantageous to have a protection scheme that does not require special devices such as Zener diodes. It would also be advantageous to have a protection scheme that does not require excessive current drainage during a short circuit avoiding strain on layout and other performance criteria. It would also be advantageous to have a protection scheme that may be readily implemented with current CMOS manufacturing technologies.

BRIEF DESCRIPTION OF THE DRAWINGS

Preferred embodiments of the present invention will now be described with reference to the accompanying drawings wherein.

DETAILED DESCRIPTION OF THE INVENTION

According to one aspect of the present invention there is provided an apparatus for protecting a device against an over-voltage condition that is in excess of its breakdown voltage, including a detector for detecting said over-voltage condition; and a protection circuit for protecting said device in response to said detector detecting said over-voltage condition.

The detector may include a reference generator for generating at least one reference signal. The detector may include a first maximum voltage selector following the reference generator and an auxiliary voltage reference generator following the first maximum voltage selector. The detector may include a second maximum voltage selector following the auxiliary voltage reference generator and a third maximum voltage selector following the second maximum voltage selector.

The detector may include a short circuit flag module following the auxiliary voltage reference generator for producing a logical signal representing said over-voltage condition. The protection circuit may include at least one transmission gate and at least one PMOS device such as a PMOS transistor.

The at least one transmission gate and PMOS device may be controlled to protect the device in response to the over-voltage condition. The transmission gate and PMOS device may be controlled to pass a data signal during normal operation of the device and to pass the at least one reference signal in response to the over-voltage condition. The at least one reference signal may be applied to a gate and/or a drain and/or a source and/or a well of the device such that a voltage across the device does not exceed the breakdown voltage. The at least one reference signal may be derived from the over-voltage condition independent of whether a supply of power to the device is present. The device may include a driver stage of a transmitter or input stage of a receiver for a data line. The data line may be associated with a universal serial bus.

According to a further aspect of the present invention there is provided a method for protecting a device against an over-voltage condition that is in excess of its breakdown voltage, including detecting the over-voltage condition; and protecting said device in response to detecting said over-voltage condition.

Figure 3:
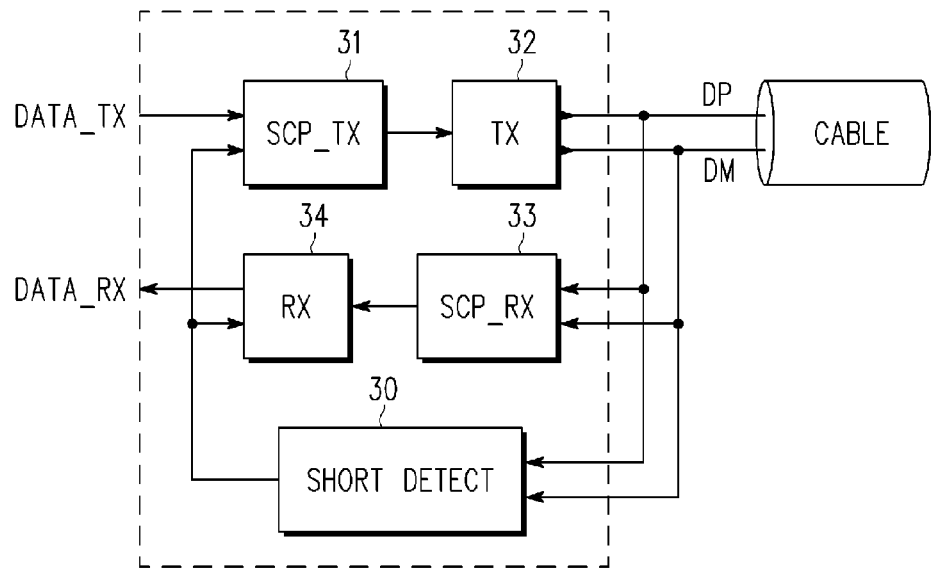
FIG. 3 shows a block diagram of a proposed SCP scheme according to one embodiment of the present invention.

FIG. 3 shows a block diagram of an SCP scheme according to one embodiment of the present invention. The scheme is suitable for protecting a USE data bus associated with a USB module. The SCP scheme includes a short detect module 30 for detecting a short circuit condition and for generating voltage references. The scheme includes first protection circuitry 31 for protecting sensitive devices in a transmitter module 32 and second protection circuitry 33 for protecting sensitive devices in a receiver module 34.

There may be identical and independent detection and protection circuitry for the DP and DM paths associated with the USB module. For simplicity, one network will be addressed below with the understanding that corresponding circuitry may be used when DP or DM or both are shorted to a power supply line (VBUS).

The SCP scheme according to the present invention includes standard devices that may be implemented within the realms of current CMOS process technologies. The SCP scheme may protect devices in short/over-voltage conditions even when a power supply is not present while limiting current paths in all modes. Thus, extra layout considerations may not be required.

Figure 4:
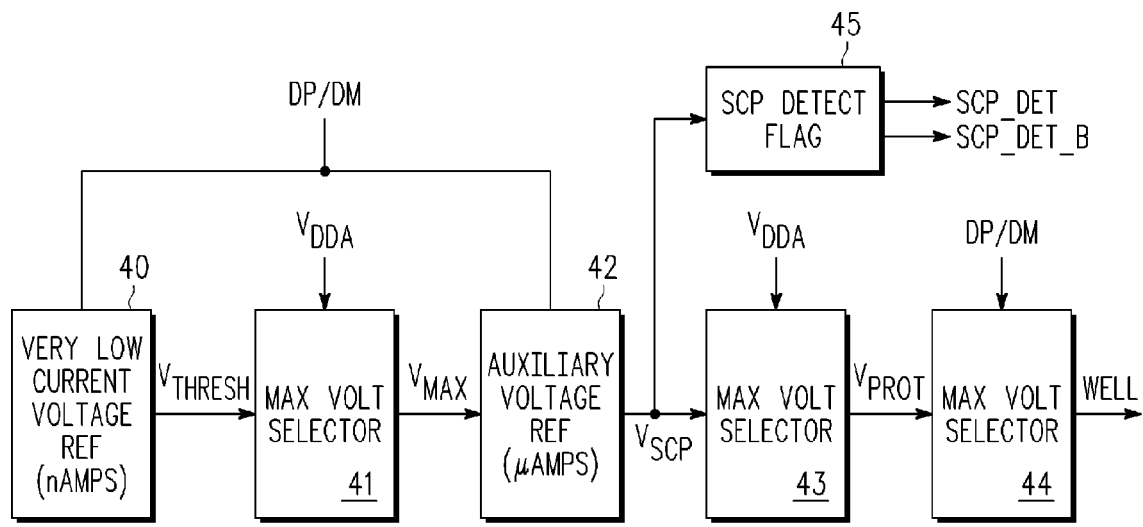
FIG. 4 shows a block diagram of a short detect circuit of FIG. 3.

FIG. 4 shows a block diagram of the short detect module 30. A voltage reference generator 40 is followed by a maximum voltage selector 41 and an auxiliary voltage reference generator 42. The auxiliary voltage reference generator 42 is followed by maximum voltage selectors 43 and 44 and short circuit flag 45.

Figure 5A:
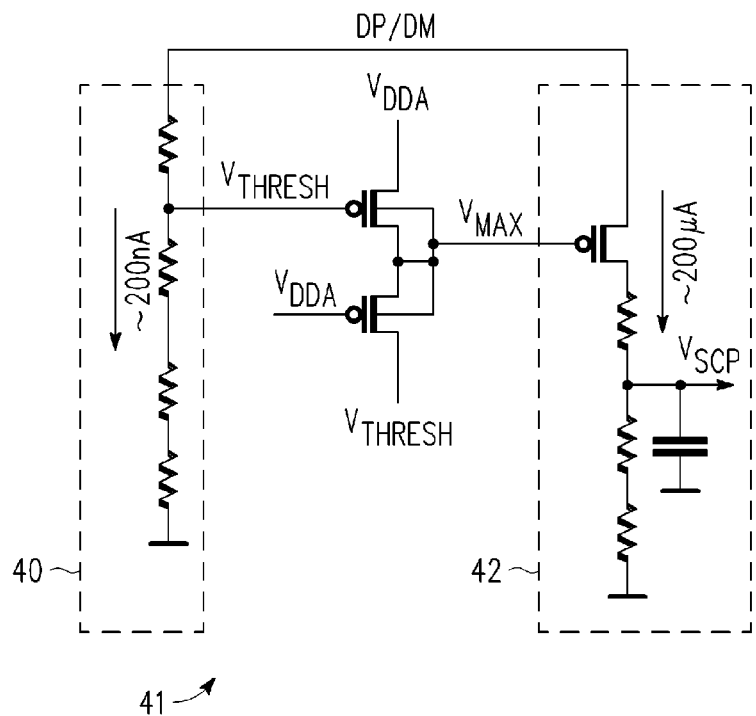
FIG. 5A shows a circuit diagram of a generator of Vscp of FIG. 4.

FIG. 5A shows a detailed circuit diagram of the voltage reference generator 40, maximum voltage selector 41 and auxiliary voltage reference generator 42. The voltage reference generator 40 generates a voltage reference (Vthresh) from DP (or DM) using a relatively very low current (200 nA) resistor divider such that normal operation is unaffected. Vthresh provides a measure of the voltage applied to data line DP (or DM) independent of the presence of a supply of power. The output of the maximum voltage selector 41 is Vmax, which is the higher of Vthresh and Vdda. Thus, Vmax is valid whether the supply of power is present or not. The auxiliary voltage reference generator 42 is turned on only in a short-circuit condition and generates a voltage reference (Vscp) using a relatively higher current (200 μA) resistor divider.

Figure 5B:
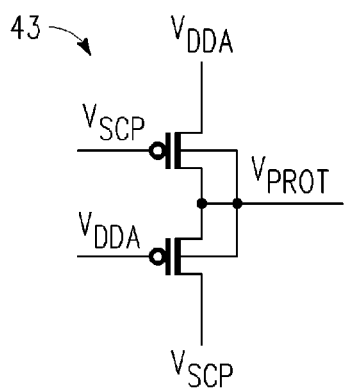
FIG. 5B shows a circuit diagram of a generator of Vprot of FIG. 4.
Figure 5C:
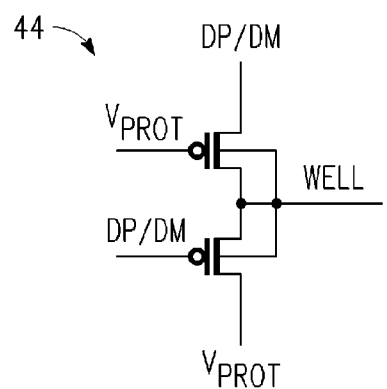
FIG. 5C shows a circuit diagram of a generator of Well of FIG. 4.
Figure 5D:
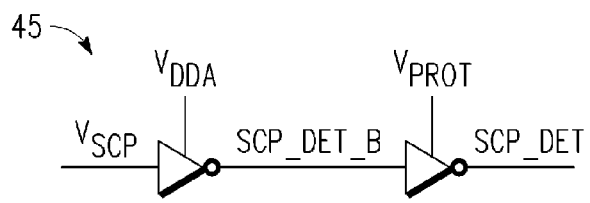
FIG. 5D shows a circuit diagram of a generator of scp_det of FIG. 4.

FIGS. 5B and 5C show generation of Vprot and Well signals using the maximum voltage selectors 43 and 44, respectively. Vprot, generated using the voltage selector 43, is the higher voltage of Vscp and supply Vdda. Well, generated using the voltage selector 441 is the higher voltage of Vprot and supply Data Line (DP/DM). Both of the Vprot and Well signals are applied to gate, and/or drain, and/or source or and/or body connections of transistors to protect the transistors from over-voltage stress. FIG. 5D shows generation of scp_det_b and scp_det. The logic signals scp_det and scp_det_b indicate a short condition, i.e. scp_det=LOW and scp_det_b=HIGH denote a normal operating condition, while scp_det=HIGH and scp_det_b=LOW denote a short condition.

Under normal operation and when a supply of power (Vdda) is present, Vthresh<Vdda and the output Vmax of the maximum voltage selector 41 is Vmax=max(Vdda, Vthresh)=Vdda In a normal condition, this causes the auxiliary reference generator 42 to be always OFF or to consume relatively little current. Hence
Vscp=0
Vprot=max(Vdda, Vscp)=Vdda
Well=max(Vprot, DP/DM)=Vprot=Vdda
scp_det_b=Vdda (Logic HIGH)
scp_det=0

In a short condition, there are two possibilities.
a) Firstly when Vdda is valid,
Vthresh<Vdda
Vmax=Vdda
DP>Vmax This causes auxiliary voltage reference generator 42 (typically consuming around 200 uA) to turn ON and hence
Vscp>0
Vprot=max(Vscp, Vdda)=Vdda
Well=max(Vprot, DP)=DP
scp_det_b=0
scp_det=Vdda (Logic HIGH)
b) Secondly when Vdda is not present i.e. the USB module is powered off and a short condition occurs,
Vthresh>Vdda
Vmax=Vthresh
DP>Vmax This again causes the auxiliary current reference to turn ON and
Vscp>0
Vprot=max(Vscp, Vdda)=Vscp
Well=max(Vprot, DP)=DP
scp_det_b=0
scp_det=Vprot (logic HIGH)

Thus, it may be seen that in both cases, namely when Vdda is either valid or is not present, reference voltages Vscp and Vprot are generated and the Well signal goes to maximum voltage. The logic signals scp_det and scp_det_b also flag a short condition. Additionally, generation of the Well signal is through a cascade of two Vmax selectors 43, 44 so that individual selectors are protected against high-voltage stress. Care is taken so that Vscp is decoupled and does not trigger on AC stress conditions i.e. the short detect module 30 does not trigger during AC stress conditions and does not affect operation of the transmitter 32/receiver 34.

As noted above, conventional schemes rely on a supply voltage being present for protection to cause excessive current drainage (~150-200 mA) during shorts. Despite protecting in power-on conditions, it puts a lot of strain on layout (requiring wide metal routings to comply with electromigration rules), and is still unable to provide protection in power-off conditions.

Figure 6:
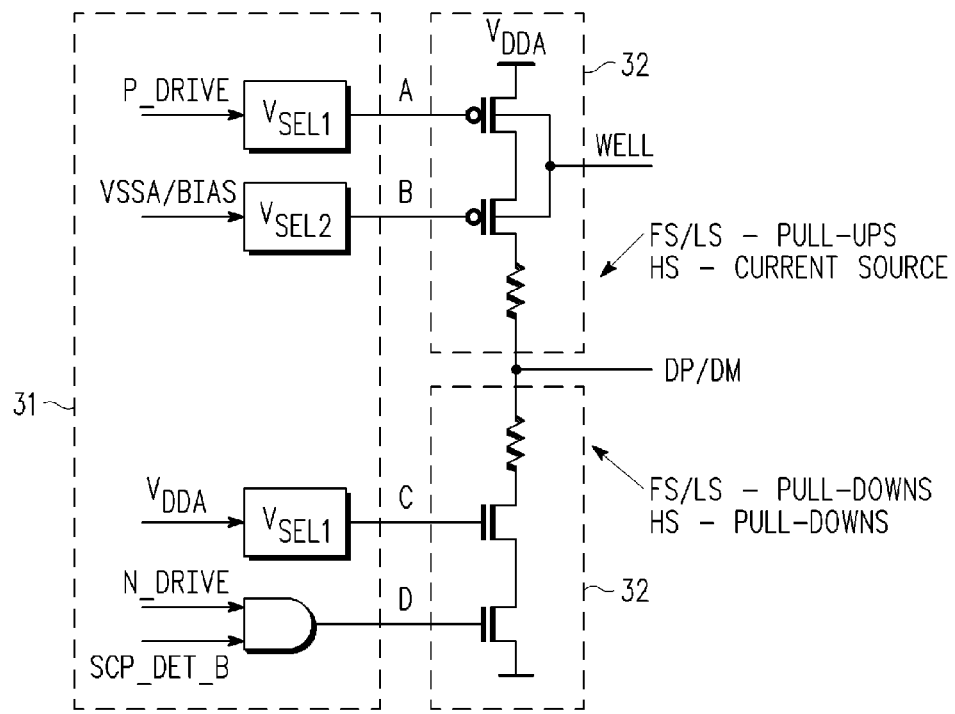
FIG. 6 shows a protection circuit for protecting a transmitter.

FIG. 6 shows details of the first protection circuitry 31 (scp_tx) for the transmitter 32. Referring to FIG. 6 in normal mode, the input signals p_drive and n_drive (p_drive, n_drive and vssa/bias correspond to data_tx in FIG. 3) are passed so that the output is driven to desired logic/voltage level. In short mode, A=Vprot
B=DP
C=Vprot
D=0
Well=DP Since Vprot is always valid in a short condition irrespective of whether the power supply is present or not, there is very little or no current consumption from DP and the devices of the transmitter 32 are protected as long as VBUS−Vprot<Device breakdown where VBUS is the voltage that is applied to data line DP/DM.

Figure 7:
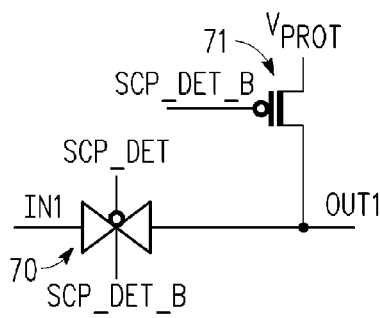
FIG. 7 shows a circuit diagram of Vsel 1 for the protection circuit of FIG. 6.
Figure 8:
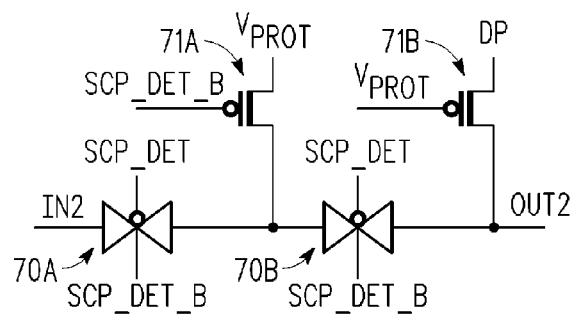
FIG. 8 shows a circuit diagram of Vsel 2 for the protection circuit of FIG. 6.

FIGS. 7 and 8 shows details of logic cells Vsel1 and Vsel2 of FIG. 6, respectively. Logic cell Vsel1 includes a transmission gate 70 and a P-type MOSFET 71. A transmission gate operates on the principle that when its control signals are in a particular logic state, the transmission gate passes its input to the output unchanged, while in an opposite logic state, the input to output path is cut-off.

Referring to FIG. 7, in normal mode, scp_det='0' and scp_det_b='1'. Therefore, Out1=In1. Also since scp_det_b='1', the PMOS device 71 is off and the path from Vprot to Out1 is cut off. In a reverse logic state i.e. scp_det='1' and scp_det_b='0', the path from In1 to Out is cut off and PMOS 71 is ON and Out1=Vprot.

Referring to FIG. 8, it can be seen that logic cell Vsel2 includes a cascade of two Vsel1 logic cells each including transmission gates 70a, 70b and P-type MOSFET 71a, 71b to protect the devices of the output stage from high-voltage stress during short of DP. The transmission gate is designed so that its own devices are also protected from over-voltage stress. These measures are omitted herein for simplicity.

Referring to FIGS. 7 and 8, in normal operation and when Vdda is present,

Out1=In1
Out2=In2

In short mode,

Out1=Vprot
Out2=DP

Figure 1:
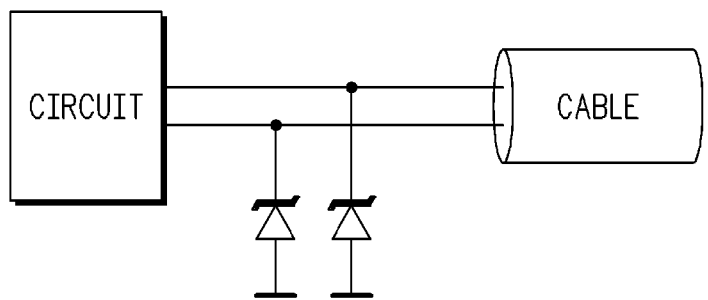
FIG. 1 shows a prior art scheme that includes use of clamping diodes for short circuit protection (SCP)
Figure 2:
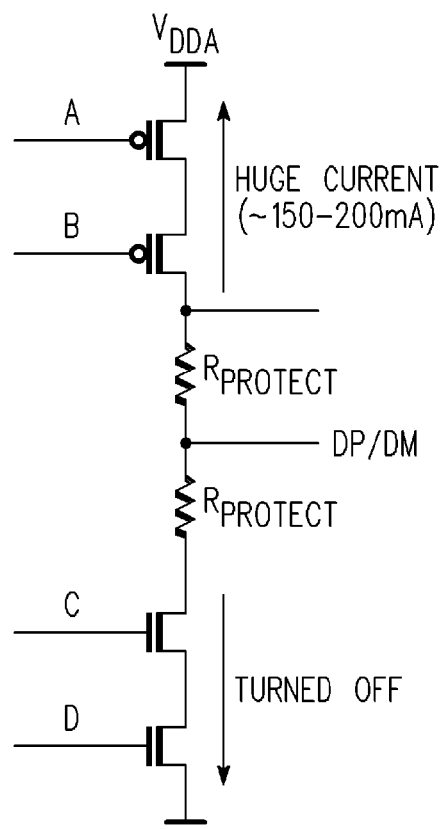
FIG. 2 shows a prior art device that relies on high current drainage to protect a transceiver.
Figure 9:
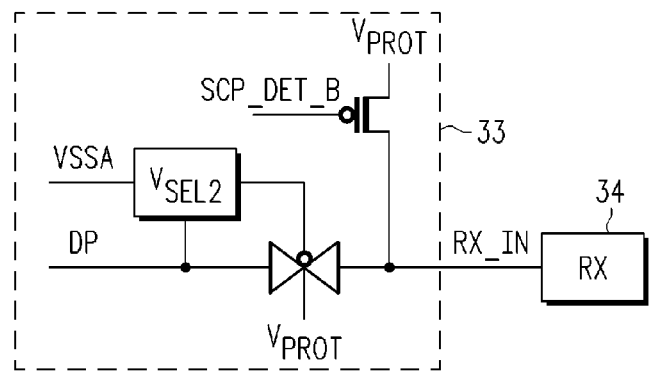
FIG. 9 shows a protection circuit for protecting a receiver.

FIG. 9 shows details of protection circuitry 33 (scp_rx) for the receiver 34. As noted above conventional schemes force high current from DP to Vdda through pull-up drivers and use the voltage drop across Rprotect (see FIG. 2) to protect devices in the receiver. The proposed scheme protects the devices while avoiding current drain from DP. Circuit Vsel2 used in FIG. 9 is the same as in FIG. 6 (see FIG. 8).

Referring to FIG. 9 in normal mode, the input signal is passed to the output.

Rx_in=DP

In short mode, from the description of Vsel2 in FIG. 8, the path from DP to Rx_in is cut-off and since scp_in_b=0, therefore, Rx_in=Vprot Since Vprot is always valid in a short condition, the devices are protected as long as Vprot<Device breakdown Finally, it is to be understood that various alterations, modifications and/or additions may be introduced into the constructions and arrangements of parts previously described without departing from the spirit or ambit of the invention.

The invention claimed is:

1. An apparatus for protecting a device against an over-voltage condition that is in excess of a breakdown voltage of the device, said apparatus comprising:
    a detector for detecting said over-voltage condition; and
    a protection circuit, connected to said detector, for protecting said device in response to said detector detecting said over-voltage condition,
    wherein said detector includes a reference generator for generating at least one reference signal, a first maximum voltage selector connected to said reference generator, and an auxiliary voltage reference generator connected to said first maximum voltage selector for generating a signal ($V_{scp}$) indicating said over-voltage condition.

2. The over-voltage protection apparatus of claim 1, wherein said detector includes a second maximum voltage selector following said auxiliary voltage reference generator for producing a first reference signal and a third maximum voltage selector following said second maximum voltage selector for producing a second reference signal.

3. The over-voltage protection apparatus of claim 1, wherein said detector includes a short circuit flag module following said auxiliary voltage reference generator for producing a logical signal representing said over-voltage condition.

4. The over-voltage protection apparatus of claim 1, wherein said at least one reference signal is applied to at least one of a gate, a drain, a source and a well of said device such that a voltage across said device does not exceed said breakdown voltage.

5. The over-voltage protection apparatus of claim 1, wherein said at least one reference signal is derived from said over-voltage condition independent of whether a supply of power to said device is present.

6. The over-voltage protection apparatus of claim 1, wherein said protection circuit includes at least one transmission gate and at least one PMOS device and wherein said transmission gate and said PMOS device are controlled to protect said device in response to said over-voltage condition.

7. The over-voltage protection apparatus of claim 6, wherein said transmission gate and said PMOS device are controlled to pass a data signal during normal operation of said device and to pass at least one reference signal in response to said over-voltage condition.

8. The over-voltage protection apparatus of claim 1, wherein said device includes at least one of a driver stage of a transmitter and an input stage of a receiver.

9. A method for protecting a device against an over-voltage condition that is in excess of its breakdown voltage, said method comprising:
    detecting said over-voltage condition; and
    protecting said device in response to detecting said over-voltage condition,
    wherein said detecting step includes,
        generating at least one reference signal,
        selecting a first maximum voltage after generating said at least one reference signal, and
        generating an auxiliary voltage reference signal using said first maximum voltage for indicating said over-voltage condition.

10. The method for protecting a device against an over-voltage condition of claim 9, wherein said detecting step includes producing a first reference signal by selecting a second maximum voltage following generating said auxiliary voltage reference signal, and producing a second reference signal by selecting a third maximum voltage following selecting said second maximum voltage.

11. The method for protecting a device against an over-voltage condition of claim 9, wherein said detecting step includes flagging said over-voltage condition following generating said auxiliary voltage reference signal by producing a logical signal representing said over-voltage condition.

12. The method for protecting a device against an over-voltage condition of claim 9, wherein said at least one reference signal is derived from said over-voltage condition independent of whether a supply of power to said device is present.

13. The method for protecting a device against an over-voltage condition of claim 9, further comprising:
applying said at least one reference signal to at least one of a gate, a drain, a source, and a well of said device such that a voltage across said device does not exceed said breakdown voltage.

14. The method for protecting a device against an over-voltage condition of claim 9, wherein said protecting step includes controlling at least one transmission gate and at least one PMOS device to protect said device in response to said over-voltage condition.

15. The method for protecting a device against an over-voltage condition of claim 14, further comprising:
controlling said transmission gate and said PMOS device to pass a data signal during normal operation of said device and to pass at least one reference signal in response to said over-voltage condition.

16. The method for protecting a device against an over-voltage condition of claim 9, wherein said device includes at least one of a driver stage of a transmitter and an input stage of a receiver for a data line.

* * * * *